US007217647B2

(12) United States Patent
Yang

(10) Patent No.: US 7,217,647 B2
(45) Date of Patent: May 15, 2007

(54) STRUCTURE AND METHOD OF MAKING A SEMICONDUCTOR INTEGRATED CIRCUIT TOLERANT OF MIS-ALIGNMENT OF A METAL CONTACT PATTERN

(75) Inventor: Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 10/904,330

(22) Filed: Nov. 4, 2004

(65) Prior Publication Data
US 2006/0099729 A1 May 11, 2006

(51) Int. Cl.
H01L 21/4763 (2006.01)

(52) U.S. Cl. .............. 438/618; 438/642; 438/649; 438/652; 438/655; 257/E21.002

(58) Field of Classification Search ............... None
See application file for complete search history.

(56) References Cited

U.S. PATENT DOCUMENTS

| 5,341,028 | A | * | 8/1994 | Yamaguchi et al. | 257/344 |
|---|---|---|---|---|---|
| 5,780,348 | A | * | 7/1998 | Lin et al. | 438/303 |
| 5,792,684 | A | * | 8/1998 | Lee et al. | 438/238 |
| 5,953,614 | A | * | 9/1999 | Liu et al. | 438/303 |
| 5,990,524 | A | * | 11/1999 | En et al. | 257/382 |
| 6,171,954 | B1 | | 1/2001 | Hsu | |
| 6,214,679 | B1 | * | 4/2001 | Murthy et al. | 438/299 |
| 6,306,713 | B1 | * | 10/2001 | Hu et al. | 438/299 |
| 6,414,375 | B1 | * | 7/2002 | Ohkawa | 257/637 |
| 6,518,618 | B1 | * | 2/2003 | Fazio et al. | 257/315 |
| 6,630,721 | B1 | * | 10/2003 | Ligon | 257/413 |
| 6,642,119 | B1 | * | 11/2003 | Pelella et al. | 438/303 |
| 6,878,597 | B2 | * | 4/2005 | Kim | 438/303 |
| 6,943,071 | B2 | * | 9/2005 | Fazio et al. | 438/201 |
| 2002/0137295 | A1 | * | 9/2002 | Thei et al. | 438/296 |
| 2002/0149050 | A1 | * | 10/2002 | Fazio et al. | 257/314 |
| 2003/0181005 | A1 | * | 9/2003 | Hachimine et al. | 438/231 |
| 2003/0211717 | A1 | | 11/2003 | Seo et al. | |
| 2004/0203211 | A1 | * | 10/2004 | Yang et al. | 438/299 |
| 2005/0040472 | A1 | * | 2/2005 | Oh et al. | 257/382 |
| 2005/0260819 | A1 | * | 11/2005 | Belyansky et al. | 438/305 |

* cited by examiner

Primary Examiner—Michael Lebentritt
Assistant Examiner—Angel Roman
(74) Attorney, Agent, or Firm—Todd M. C. Li

(57) ABSTRACT

Disclosed is a method of fabricating a field effect transistor. In the method, a gate stack on a top surface of a semiconductor substrate is formed, and then a first spacer is formed on a sidewall of the gate stack. Next, a silicide self-aligned to the first spacer is deposited in/or on the semiconductor substrate. Subsequently a second spacer covering the surface of the first spacer, and a contact liner over at least the gate stack, the second spacer and the silicide, are formed. Then an interlayer dielectric over the contact liner is deposited. Next, a metal contact opening is formed to expose the contact liner over the silicide. Finally, the opening is extended through the contact liner to expose the silicide without exposing the substrate.

13 Claims, 11 Drawing Sheets

STRUCTURE AND METHOD OF MAKING A SEMICONDUCTOR INTEGRATED CIRCUIT TOLERANT OF MIS-ALIGNMENT OF A METAL CONTACT PATTERN

BACKGROUND OF INVENTION

The present invention relates to the fabrication of semiconductor integrated circuits, and more specifically to a structure and method of making a semiconductor integrated circuit which is tolerant of mis-alignment of the metal contact pattern to the gate pattern.

In a semiconductor integrated circuit, a metal contact such as tungsten is used to connect the transistor gate, source/drain, and body to backend wiring. A conventional method for forming a metal contact will be briefly explained.

FIGS. 10 and 11 illustrate stages in conventional fabrication of a semiconductor integrated circuit.

Referring to FIG. 10, a conventional method of forming a metal contact in a semiconductor integrated circuit includes a step of forming a gate stack 950 of a PFET 901 and a gate stack 960 of an NFET 903, on a substrate 900 which includes a silicon substrate 902, a buried oxide (BOX) layer 904 and a semiconductor layer 906. Then oxide spacers 972, 982 are formed on side walls of the gate stacks 950, 960 followed by formation of source drain (S/D) extensions 920, 922, 924, 926 in a semiconductor layer 906. Next, nitride spacers 974, 984 are formed on the oxide spacers 972, 982 respectively. Subsequently, S/D regions 912, 914, 916, 918 are formed. Further, using the nitride side walls 974, 984 as masks, metal silicide regions 932, 934, 936, 938 are formed on the S/D regions 912, 914, 916, 918, respectively. Next, a contact liner 988, commonly $Si_3N_4$, is deposited over the substrate 900, followed by deposition of an interlayer dielectric layer (IDL) 990 and planerization. Thereafter, photolithographic and etching techniques are used to pattern the IDL 990, forming contact openings 992, 994, 996, 998 that expose the silicide on the S/D regions as illustrated in FIG. 11. The process typically proceeds by a first anisotropic etch process to form openings in the interlayer dielectric 990 stopping on the contact liner 988, followed by a second anisotropic etch through the contact liner 988, using the silicide 932, 934, 936, 938 as an etching stop.

In the photolithography, the pattern for the contact openings is inevitably slightly mis-aligned to the gate pattern. Thus, at least a portion of a contact opening may be mis-aligned over the side walls 974, 984. However, the etch process designed to etch away the contact liner 988, typically nitride, has no selectivity to the spacer 974, 984, which is also typically nitride. Therefore, at least a part of the spacers 974, 978 may be etched through, exposing the underlying semiconductor layer 906. Since the silicide 932, 934, 936, 938 on the S/D regions 912, 914, 916, 918 are formed by using the side walls 974, 984, as masks, no silicide is deposited beneath the spacers 974, 984 in the semiconductor layer 906. Accordingly, the exposed portion of the substrate may be etched, causing problems such as a short 993, 997 between a metal contact and the substrate, and causing unexpected parasitic capacitance.

Further occasionally the semiconductor layer 906 is exposed between the bottom of the spacers 974, 984 and the edges 931, 933, 935, 937 of the silicide 932, 934, 936, 938 even though the spacers 974, 984 are used as masks in forming silicide 932, 934, 936, 938, increasing the possibility of causing a short between a metal contact and the substrate.

Accordingly, there is a need for a structure and method of forming a metal contact that is tolerant of mis-alignment of the contact pattern to the gate pattern and avoids shorts between the contact and substrate.

SUMMARY OF INVENTION

According to an aspect of the invention, a method of fabricating a field effect transistor is provided. The method includes steps of forming a gate stack on a top surface of a semiconductor substrate and a first spacer formed on a sidewall of the gate stack; forming, in or on the semiconductor substrate, a silicide adjacent to the first spacer; forming a second spacer covering the surface of the first spacer; forming a contact liner over at least the gate stack, the second spacer and the silicide; forming an interlayer dielectric over the contact liner; forming an opening to expose the contact liner over the silicide; and extending the opening through the contact liner to expose the silicide without exposing the substrate.

In another aspect of the invention, the second spacer further covers at least a portion of the silicide so that the semiconductor layer is not exposed even if a gap between the second spacer and the silicide exists.

These, and other aspects of the present invention will be better appreciated and understood when considered in conjunction with the following description and the accompanying drawings, which are not necessarily drawn to scale.

DETAILED DESCRIPTION

FIGS. 1 through 7 illustrate stages in processing to form a PFET 101 and an NFET 103 according to an embodiment of the invention.

Figure 1:
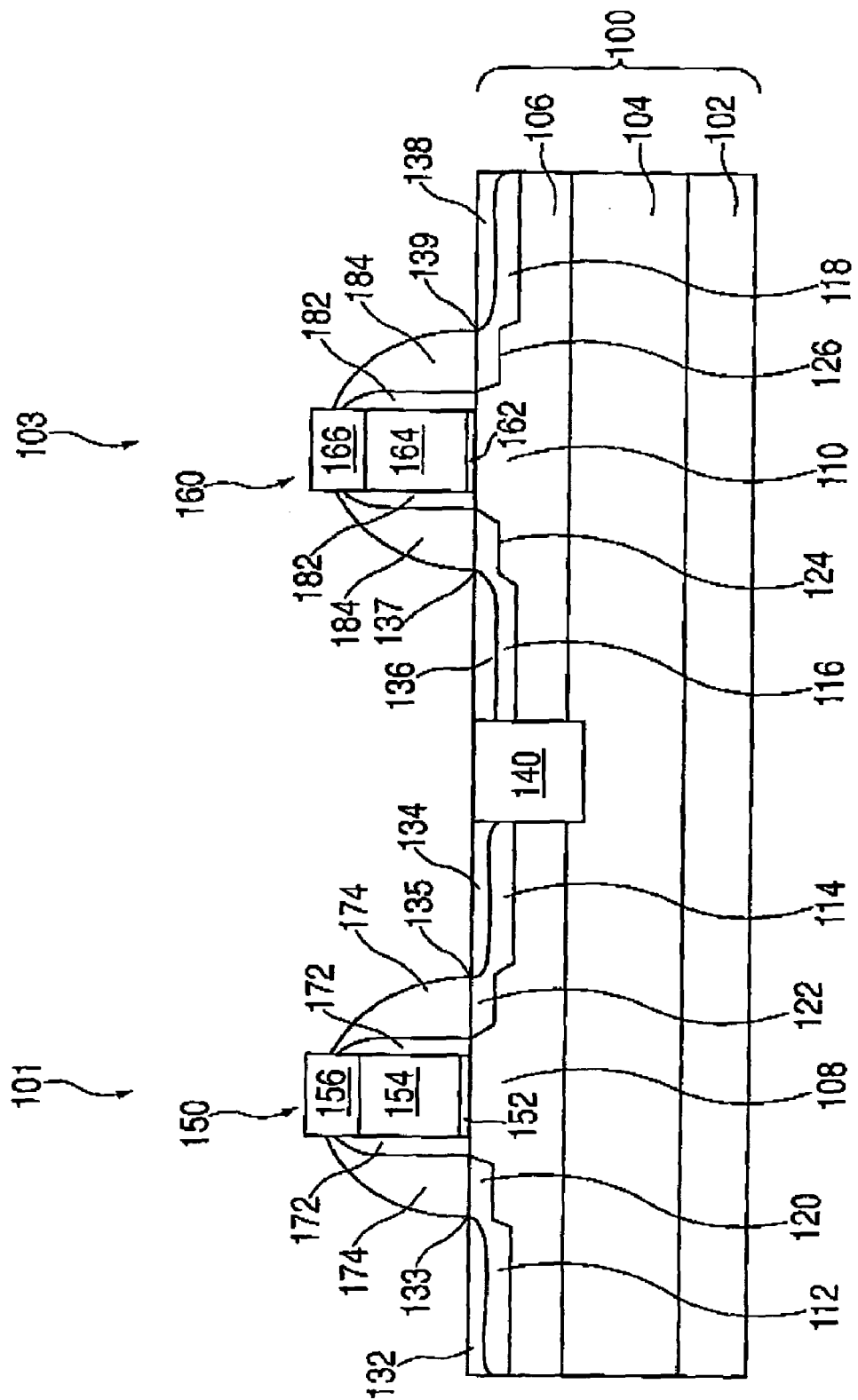
FIGS. 1 through 7 illustrate stages in fabrication of a PFET and an NFET according to an embodiment of the invention.

Firstly, as shown in FIG. 1, a PFET 101 and an NFET 103 are formed on a substrate 100. The substrate 100 preferably includes a silicon substrate 102, buried oxide (BOX) layer 104, a semiconductor layer 106 and a trench isolation region 140. Alternatively, the substrate 100 may be a bulk semiconductor substrate such as silicon. However, the invention is not limited to silicon substrates but other types of semiconductors such as III–V compound semiconductor materials, e.g. gallium arsenide (GaAs), may be used.

The PFET 101 and NFET 103 include gate stacks 150, 160, channel regions 108, 110, source drain extensions 120, 122, 124, 126, S/D regions 112, 114, 116, 118, silicide S/D regions (hereinafter "silicide") 132, 134, 136, 138 in the S/D regions respectively. The silicide may include, for example, titanium (Ti), cobalt (Co), Nickel (Ni), tungsten (W) or platinum (Pt). The gate stacks 150, 160 may further include gate dielectric layers 152, 162 on the channel regions 108, 110, and gate conductor portions 154, 164, such as polysilicon. Metal lower resistance portions 156, 166 may also be included in some embodiments.

Adjacent the side walls of the gate stacks 150, 160, multiple spacers 172, 174, 182, 184 are preferably formed. Alternatively, a single spacer may be deposited on the side walls of each gate stack 150, 160. The spacers 174, 184 preferably include silicon nitride ($Si_3N_4$). The spacers 174, 184 are used as masks in the formation of the silicide 132, 134, 136, 138 in the S/D regions 112, 114, 116, 118.

The S/D regions 112, 114, 116, 118 may be raised S/D regions, which may be formed by selective epitaxial growth.

The silicide 132, 134, 136, 138 may be formed by a method such as chemical vapor deposition (CVD) of silicide, or metal sputtering followed by an anneal.

For example, using CVD, layers of silicide are formed on the S/D regions 112, 114, 116, 118. At the portions of the silicide adjacent to the gate stacks 150, 160, the layers of silicide preferably grow in contact with the outer surfaces of the spacers 174, 184 so that semiconductor layer 106 is not exposed.

Alternatively, the silicide may be formed by metal sputtering which preferably includes the steps of (1) sputtering metal into the S/D regions 112, 114, 116, 118, using the spacers 174, 184 as masks, (2) performing a first annealing at about 200 to 500° C., (3) removing non-reacted metal, and (4) performing a second annealing at about 400 to 750° C. Since the spacers 174, 184 are used as masks, silicide 132, 134, 136, 138 are preferably formed in contact with the bottom of the spacers 174, 184 so that the semiconductor layer 106 is not exposed.

However, in both methods, a gap between the silicide 132, 134, 136, 138 and the corresponding spacers 174, 184 may be formed. That is, the semiconductor layer 106 may exposed between the bottom portion of the spacers 174, 184 and the edges 133, 135, 137, 139 of the silicide 132, 134, 136, 138.

Figure 2:
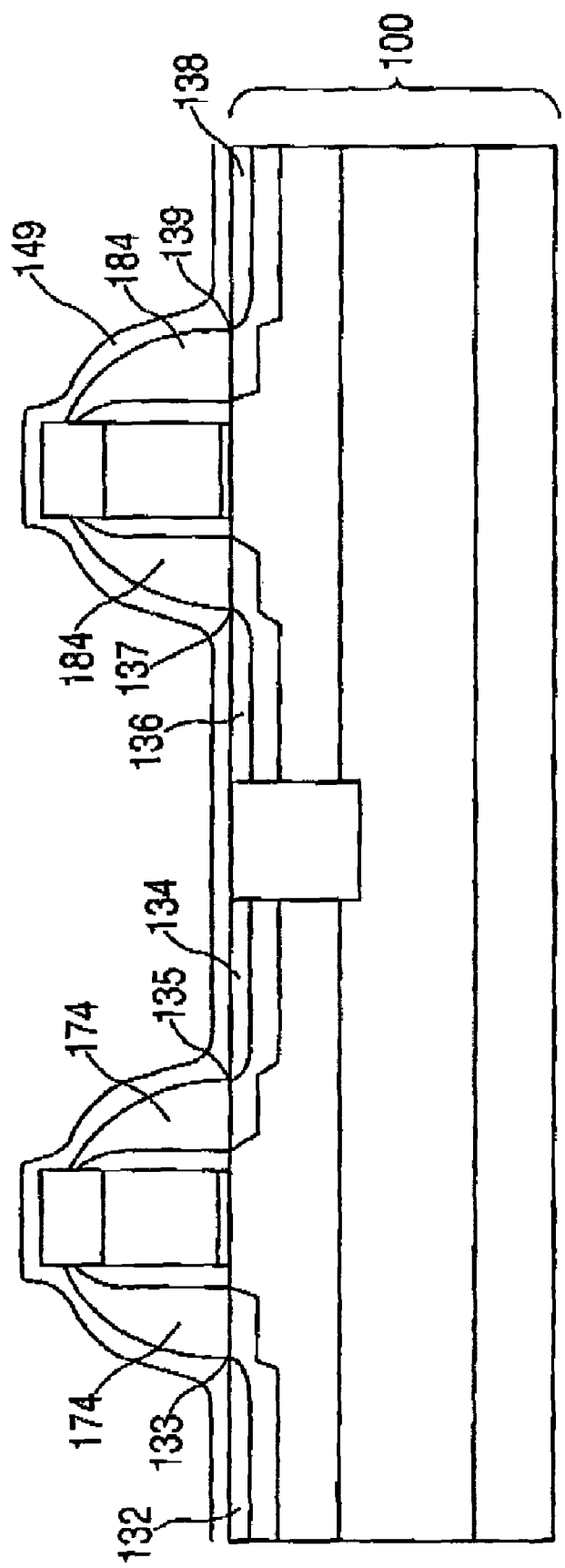

Next, as shown in FIG. 2, another dielectric layer 149, is formed over the top surface of the substrate 100. The dielectric material 149 is different than the mask spacers 174, 184; for example if mask spacers 174, 184 are nitride, the dielectric layer 149 is preferably oxide. In the case of an oxide, the formation of the layer 149 preferably includes (1) applying a precursor, such as tetra ethyl ortho silicate (TEOS), $SiH_4$, $SiCl_2H_2$, over the substrate 100, and (2) applying heat to grow the oxide layer 149.

Heat in step (2) is preferably applied at a temperature so as not to oxidize the silicide 132, 134, 136, 138. For example, when the silicide includes Ni, the oxide layer 149 is preferably be grown at a temperature in the range about 300° C. to 400° C. The preferable temperature is about 700° C. or less when the silicide includes Co. The thickness of the oxide layer 149 is preferably about 100 Å to 400 Å, most preferably about 160 Å to 200 Å.

The thickness of the oxide layer 149 is preferably thinner than the nitride spacers 174, 184, but sufficient thick so as to overlap the edges 133, 135, 137, 139 of the silicide 132, 134, 136, 138 so as to cover any gap between the edges 133, 135, 137, 139 of the silicide and the nitride spacers 174, 184.

Accordingly, the spacers 174, 184, gate stacks 150, 160, silicide 132, 134, 136, 138 are covered by the oxide layer 149.

Instead of an oxide layer, a layer 149 including silicon carbide (SiC) may be deposited. The layer 149 may be formed by $SiH_4$ and $CH_4$ reaction in a CVD chamber. Preferable reaction temperature is about 400° C. Thickness of the formed SiC layer 149 is preferably about 500 to 1000 Å.

Figure 3:
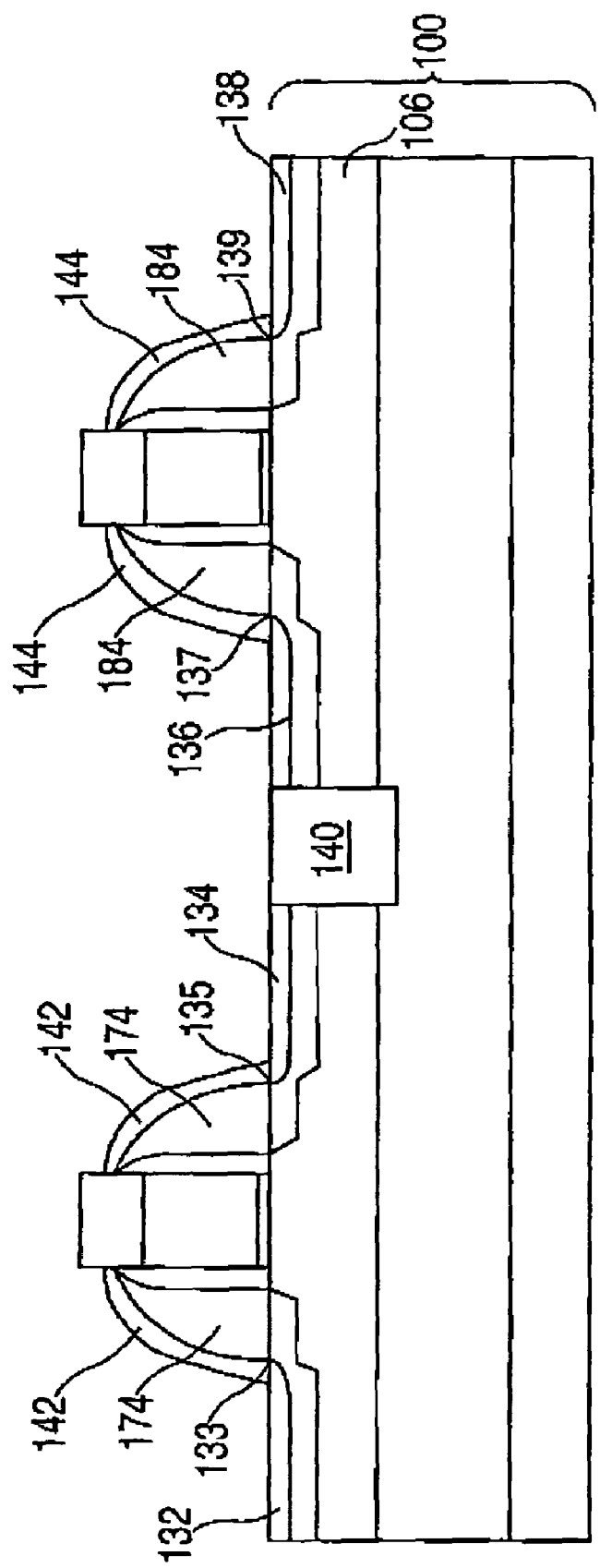

Next, as shown in FIG. 3, the oxide layer 149 is etched back by an anisotropic etch, preferably reactive ion etching (RIE), to form spacers 142, 144. The spacers 142, 144 cover the surface of the spacers 174, 184 respectively. Simultaneously, the spacers 142, 144 overlap the inner edges of the silicide 132, 134, 136, 138 at portions 133, 135, 137, 139 respectively so that junctions between silicide 132, 134, 136, 138 and spacers 174, 184 are covered by the spacers 142, 144. Accordingly, even if a gap exists between the silicide and the spacers 174, 184, the oxide layers 142, 144 cover the gap so that the semiconductor layer 106 is not exposed.

Figure 4:
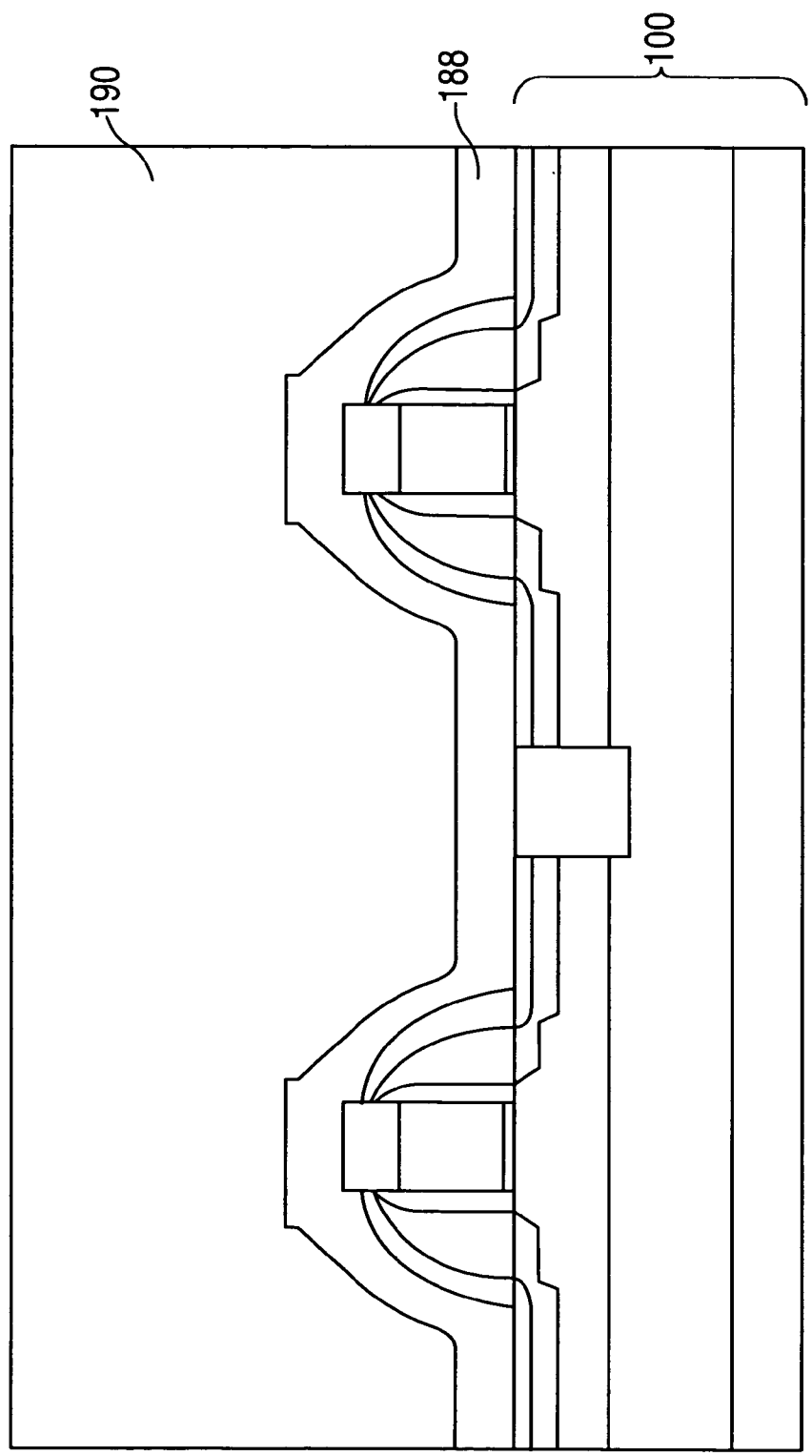

Thereafter, as shown in FIG. 4, a contact liner 188 is applied over the substrate 100. The contact liner preferably is a different material than the spacers 142, 144, and in the case of oxide spacers, 142, 144, preferably includes silicon nitride, for example $Si_3N_4$. The thickness of the contact liner 188 is preferably about 300 to 1500 Å.

Then, an inter layer dielectric (ILD) 190, which may include a low-k dielectric material, a dielectric such as borophosphosilicate glass (BPSG) or high density plasma (HDP) oxide, is deposited and planerized. The thickness of the ILD 190 is preferably about 3000 to 5000 Å.

A two-step selective etch process is used to form the contact openings.

Figure 5:
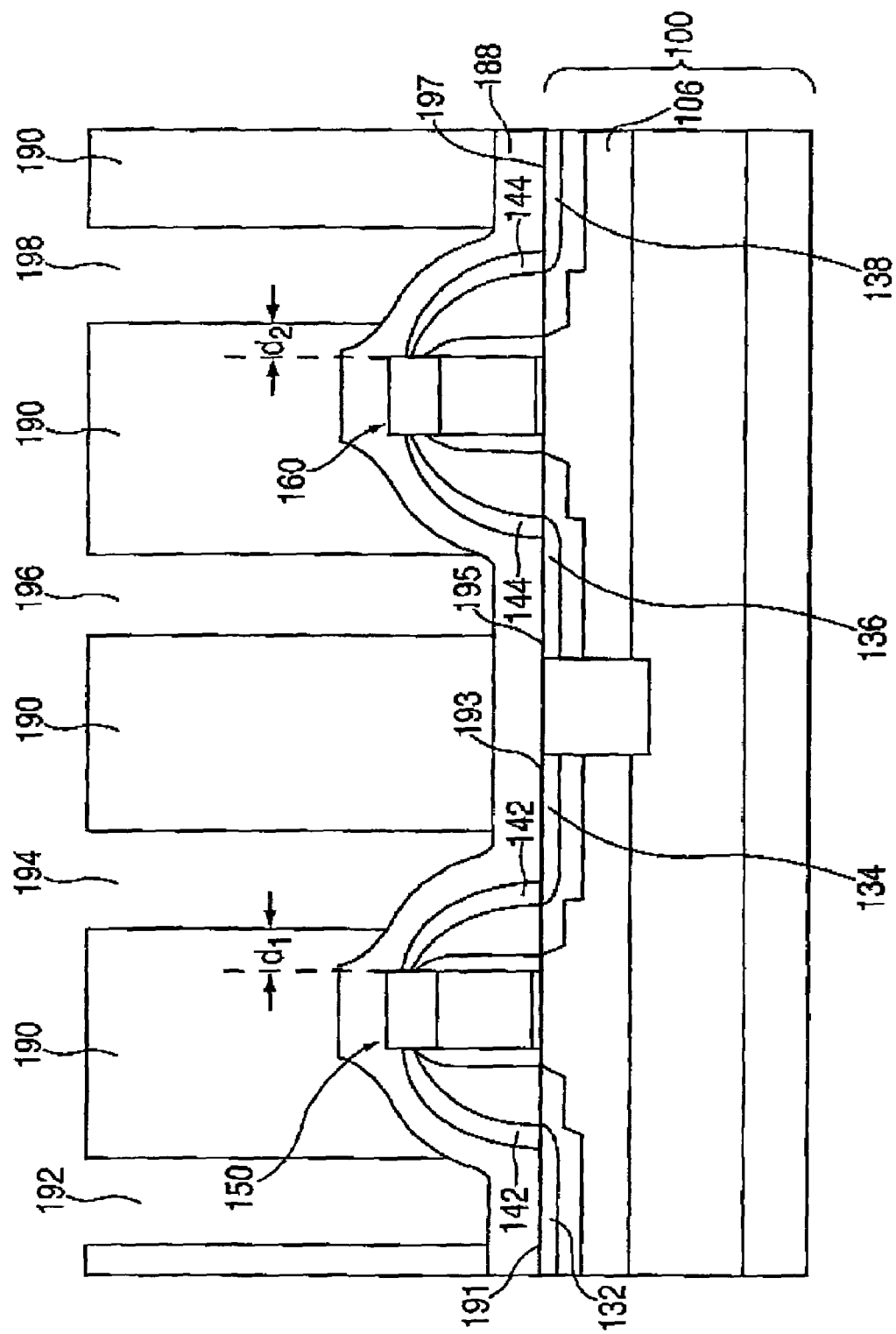

As shown in FIG. 5, photolithographic and anisotropic etching techniques, such as RIE, is used to pattern the interlayer dielectric 190, to form contact openings 192, 194, 196, 198 that expose the contact liner 188. In the first step, the etching is preferably selective to the contact liner 188 so that the etching is stopped on the contact liner 188. One skilled in the art would be able to arrange conditions for the etching to achieve the desired selectivity.

FIG. 5 shows an example where the contact opening pattern is mis-aligned to the gate pattern. Specifically, the contact openings 194, 198 are formed with unintended short distances d1, d2 from the gate stacks 150, 160 respectively.

Figure 6:
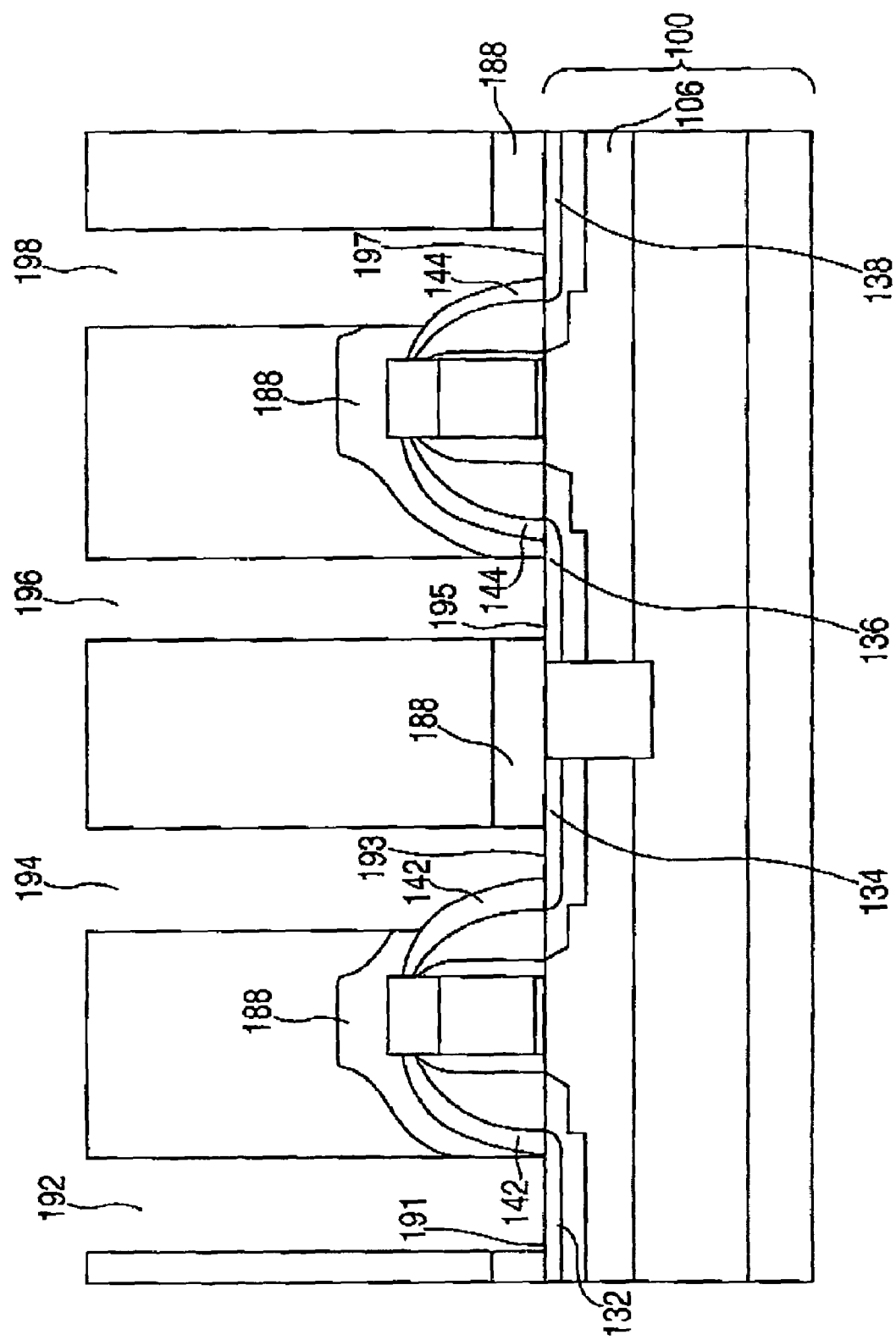

Next, a second etch step uses process conditions where the etching is selective to the spacers 142, 144 and also selective to the silicide 132, 134, 136, 138, so that the contact liner 188 is etched back to the surfaces 191, 193, 195, 197 of the silicide. Thus, as shown in FIG. 6, spacers 142, 144, are not etched back by the second etch process, so that the substrate 100, specifically the semiconductor layer 106, is not exposed at the bottom of the contact openings 192, 194, 196, 198.

Finally, metal, such as Ti, TiN, W, is filled into the contact holes to form contacts 202, 204, 206, 208 by for example sputtering or chemical vapor deposition (CVD), followed by chemical mechanical polishing (CMP).

Figure 7:
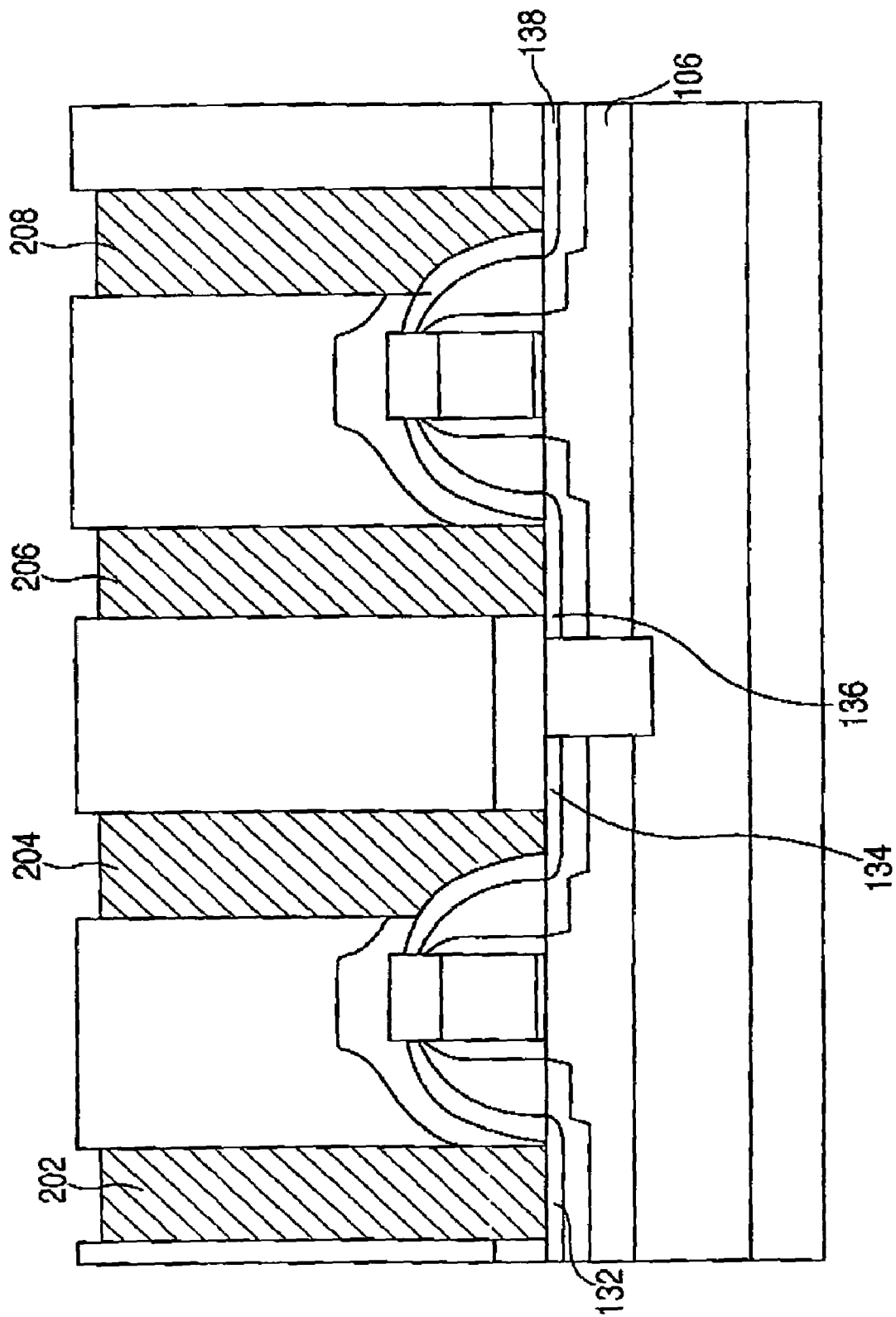

The final structure is illustrated in FIG. 7.

According to the invention, the contacts 202, 204, 206, 208 are in direct contact with the silicide 132, 134, 136, 138 and are not in contact with the semiconductor layer 106, in the case of mis-alignment.

Figure 8:
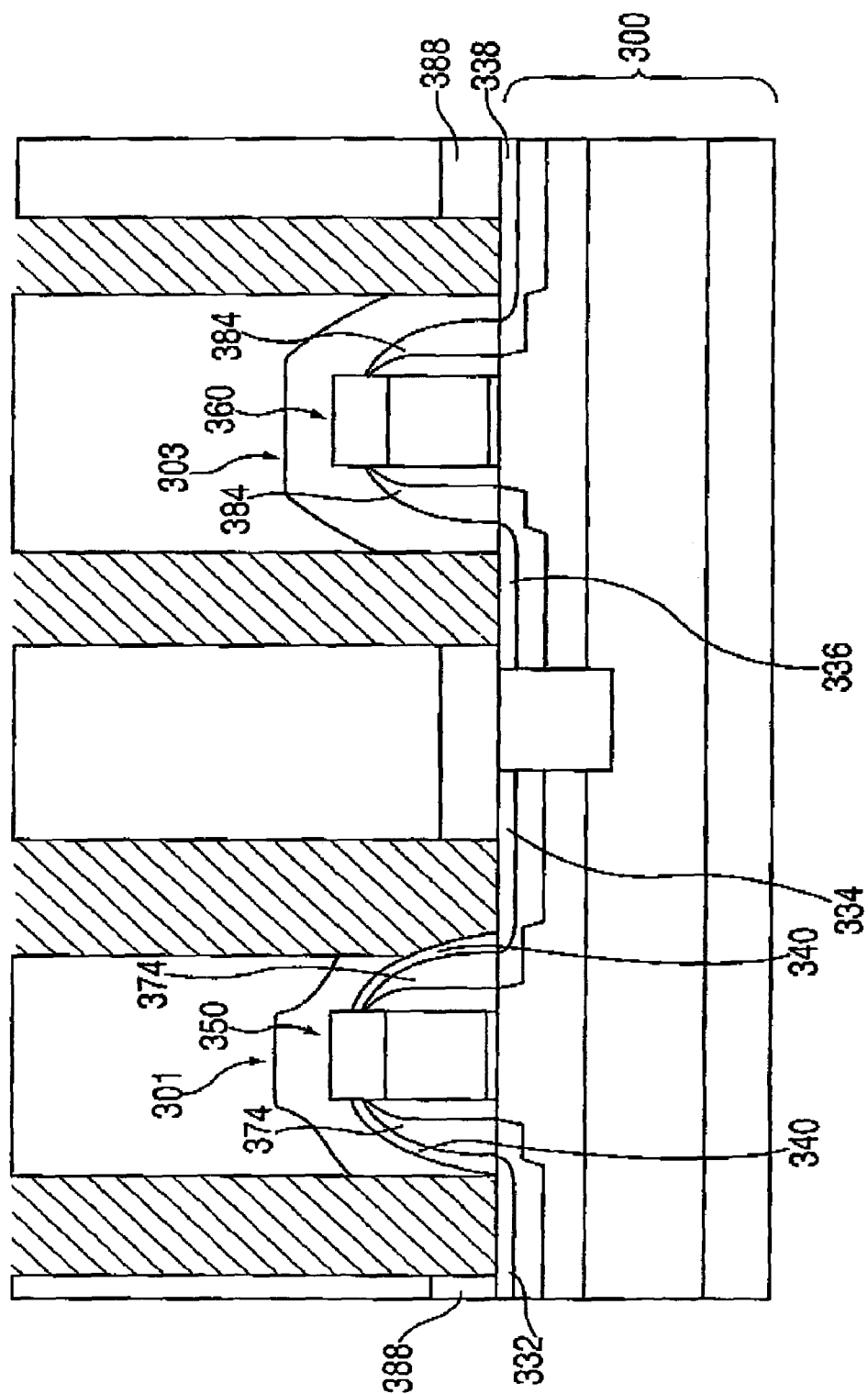
FIG. 8 illustrates a stage in fabrication of a PFET and an NFET according to another embodiment of the invention.

FIG. 8 illustrates a PFET 301 and an NFET 303 according to another embodiment of the invention.

Spacers 374 adjacent the PFET 301 are preferably thicker than spacers 384 adjacent the NFET 303. It is preferable to make the contact pitch constant for ease of connectivity with upper layers, and not too large to minimize the size of the resulting semiconductor integrated circuit. Therefore, PFET 301 tends to be more prone to mis-alignment of the metal contact to the gate pattern.

Therefore, significant improvement in yield can be achieved even if an additional spacer 340, such as an oxide layer or a SiC layer, according to the present invention is deposited over only a PFET 301.

In the embodiment illustrated in FIG. 8, a second spacer 340, preferably including silicon oxide or SiC, is formed only over spacers 374 on the side walls of a gate stack of the PFET 301. For example, on a PFET 301, the spacer 374 preferably has about 750 Å maximum thickness, and more preferably the thickness of the spacer 374 is about 100 to 300 Å. It would be readily understood by a skilled person that the spacer 340 may be formed by arranging the method as illustrated in FIGS. 1 through 7 to mask an NFET during the formation of the spacer 374 on a gate stack 350 of the PFET 301. For instance, the gate stack 350 of the PFET 301, the gate stack 360 of the NFET 303, silicide 332, 334, 336, 338 and spacers 374, 384 may be formed on the substrate 300. Then, a contact liner 388, such as silicon nitride, may be formed to first cover only the NFET 303, while masking the PFET region. The mask is removed from the PFET region. Next, the NFET region is masked and the outer spacer 340 may be formed only on the spacer 374 adjacent the PFET by means of RIE, for example, followed by a formation of a contact liner 388 only on the PFET 301.

Subsequently, the mask over the NFET is removed, and the ILD and contact openings are formed as in FIGS. 4–7 described above.

Figure 9:
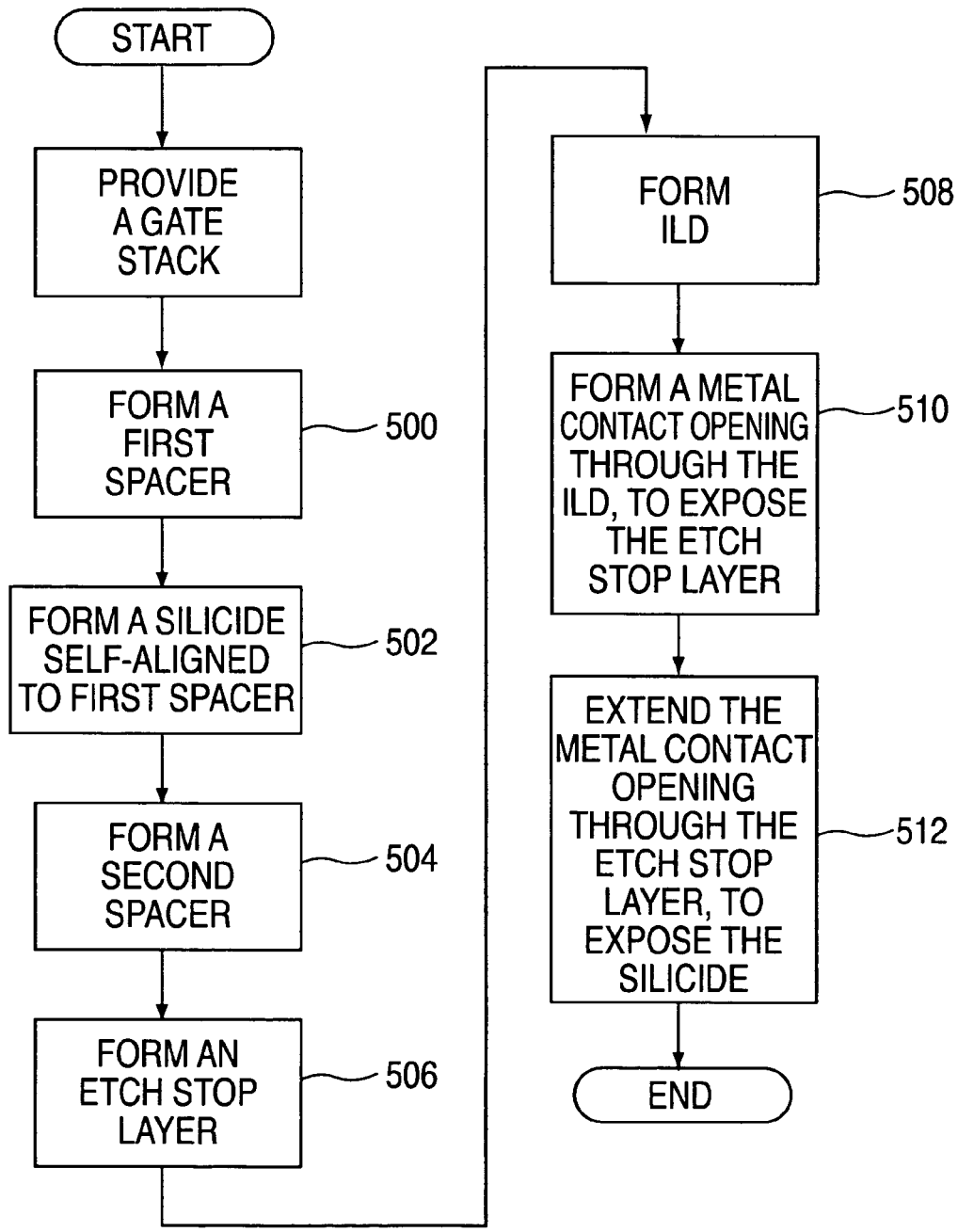
FIG. 9 shows a flow of method for fabricating a semiconductor circuit according to an embodiment of the invention.
Figure 10:
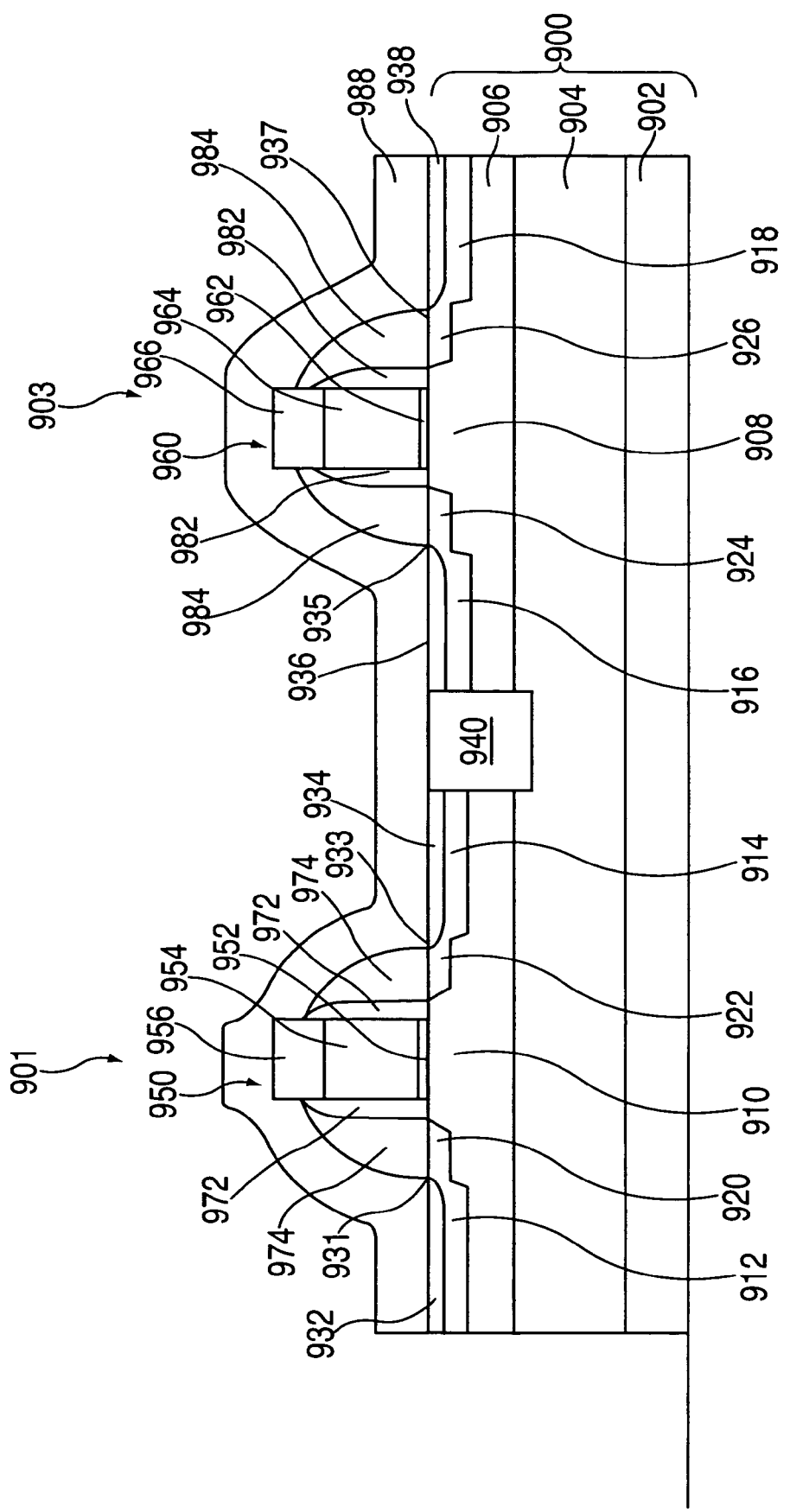
FIGS. 10 and 11 illustrate conventional stages in fabrication of a PFET and an NFET.
Figure 11:
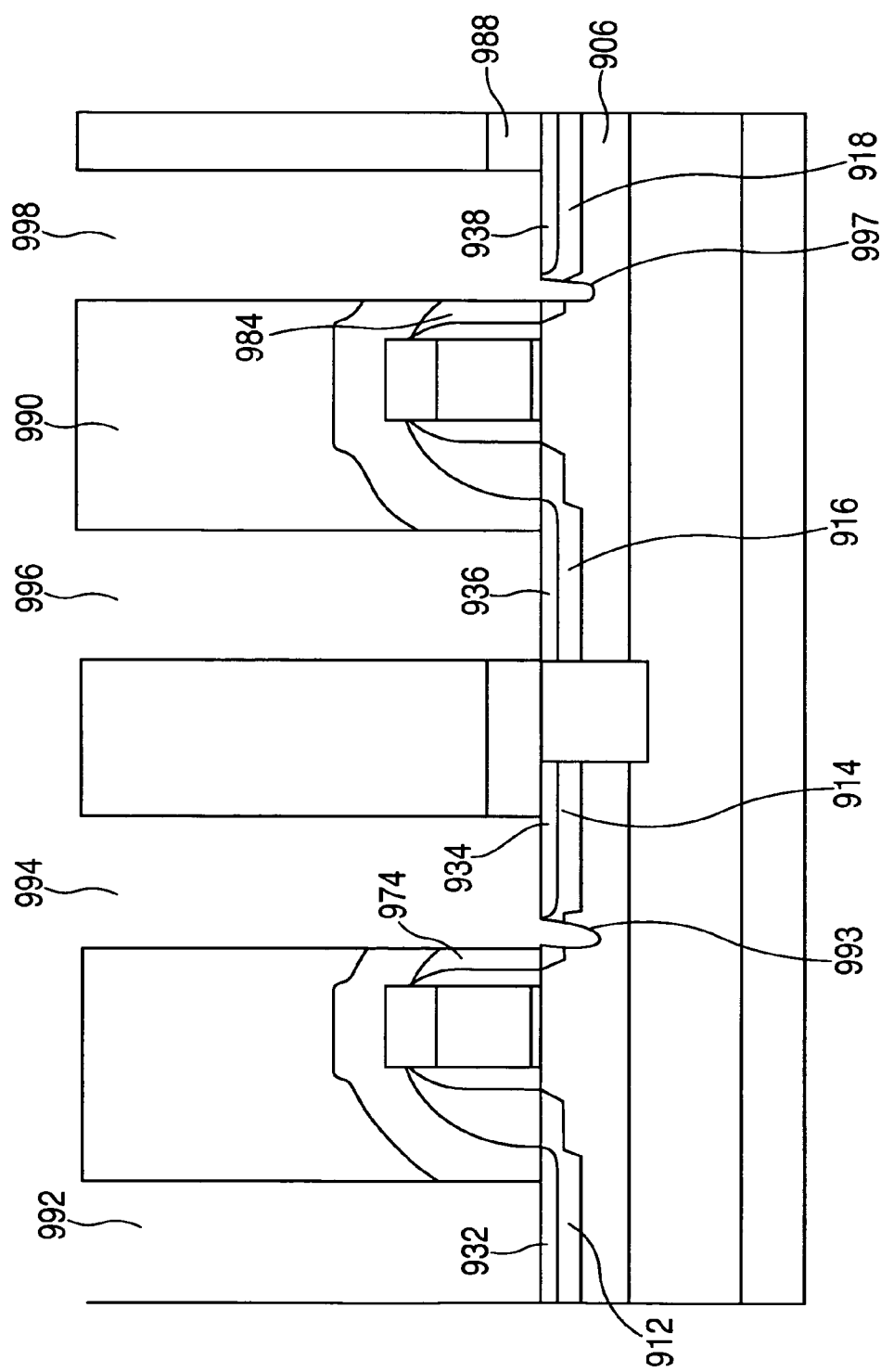

FIG. 9 shows a flow of method for fabricating a semiconductor circuit according to an embodiment of the invention.

In the method, a gate stack on a top surface of a semiconductor substrate is formed, and then a first spacer is formed on a sidewall of the gate stack (Step 500).

The first spacer may include multiple spacers, where the outer portion of the first spacer is preferably silicon nitride. Next, a silicide self-aligned to the first spacer is deposited in/or on the semiconductor substrate (Step 502).

Subsequently a second spacer covering the surface of the first spacer (Step 504), and a contact liner formed over at least the gate stack, the second spacer and the silicide (Step 506). In accordance with the invention, the contact liner is a different material than the second spacer. For example, if the second spacer is silicon oxide, the contact liner is preferably silicon nitride. The contact liner is used as an etch stop layer in a subsequent first RIE, discussed below.

Then an interlayer dielectric, such as a low-k material, BPSG or HDP oxide, over the contact liner is deposited (Step 508). The ILD is preferably different than the contact liner.

Next, a metal contact opening through the ILD is formed to expose the contact liner over the silicide (Step 510). A first RIE of the ILD selective to the contact liner is preferably used. Here, the contact liner is used as an etch stop for the first RIE step. Finally, the contact opening is extended through the contact liner to expose the silicide without exposing the substrate (Step 512). The extension is preferably performed by a second RIE selective to the second spacer and the silicide. Since the first spacer is covered by the second spacer, the first spacer is not etched through to expose the semiconductor substrate when extending the opening. Therefore, a short between a contact and the semiconductor substrate is prevented.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. A method of fabricating a field effect transistor comprising the steps of:
   providing a semiconductor substrate having a gate stack on a top surface of the semiconductor substrate, and a first spacer formed on a sidewall of the gate stack;
   forming, in or on the semiconductor substrate, a silicide adjacent to the first spacer, using the first spacer as a mask;
   forming a second spacer from one of silicon dioxide and silicon carbide adjacent to and covering the surface of the first spacer, wherein the second spacer covers only a portion of the silicide;
   forming a contact liner from silicon nitride over at least the gate stack, the second spacer and the silicide;
   forming an interlayer dielectric over the contact liner;
   using a first etch process selective to silicon nitride, forming an opening to expose the contact liner over the silicide; and,
   using a second etch process selective to both the second spacer material and the silicide, extending the opening through the contact liner to expose the silicide without exposing the substrate.

2. The method according to claim 1, wherein the first spacer includes silicon nitride.

3. The method according to claim 1, wherein the first spacer includes multiple spacers.

4. The method according to claim 1, wherein the silicide includes a metal selected from the group consisting of Ti, Co, Ni, W or Pt.

5. The method according to claim 1, wherein the thickness of the second spacer is about 100 to 400 Å.

6. The method according to claim 1, wherein the thickness of the second spacer is about 160 to 200 Å.

7. The method according to claim 1, wherein the step of forming the second spacer is performed at a temperature in the range of about 300 to 700° C.

8. The method according to claim 1, wherein the thickness of the contact liner is about 300 to 1500 Å.

9. The method according to claim 1, wherein the interlayer dielectric includes low-k material, high density plasma (HDP) oxide or borophosphosilicate glass (BPSG).

10. The method according to claim 1, wherein the thickness of the interlayer dielectric is about 3000 to 5000 Å.

11. The method according to claim 1, wherein the silicide is aligned to the first spacer.

12. The method according to claim 1, wherein a gap between the silicide and the first spacer is formed.

13. A method of fabricating field effect transistors comprising the steps of:
   forming a PFET and an NFET gate stacks on a top surface of a semiconductor substrate;
   forming first spacers formed on sidewalls of the gate stacks;
   forming, in or on the semiconductor substrate, silicide adjacent to the first spacers, using the first spacers as a mask;
   forming a second spacer from one of silicon dioxide and silicon carbide adjacent to and covering the surface of the first spacer formed on the sidewall of the PFET gate stack wherein the second spacer covers only a portion of the silicide;

forming a contact liner from silicon nitride over at least the gate stacks, the first spacer on the side wall of the NFET, the second spacer and the silicide;
forming an interlayer dielectric over the contact liner;
using a first etch process selective to silicon nitride, forming an opening to expose the contact liner over the silicide; and,
using a second etch process selective to both the second spacer material and the silicide, extending the opening through the contact liner to expose the silicide without exposing the substrate.

* * * * *